(12) United States Patent
Dole

(10) Patent No.: US 6,428,356 B1
(45) Date of Patent: Aug. 6, 2002

(54) TEST INTERFACE FOR COAXIAL CABLE

(75) Inventor: Carl William Dole, Williamsburg, IN (US)

(73) Assignee: Belden Wire & Cable Company, Richmond, IN (US)

( * ) Notice: Subject to any disclaimer, the term of this patent is extended or adjusted under 35 U.S.C. 154(b) by 0 days.

(21) Appl. No.: 09/928,724

(22) Filed: Aug. 13, 2001

(51) Int. Cl.[7] .............................................. H01R 17/04
(52) U.S. Cl. ...................................... 439/578; 439/289
(58) Field of Search ................................ 439/578, 583, 439/584, 585, 289

(56) References Cited

U.S. PATENT DOCUMENTS 4,441,781 A    4/1984  Forney, Jr. et al.
5,769,662 A  * 6/1998  Stabile et al. ............... 439/578

* cited by examiner

*Primary Examiner*—Tho D. Ta
(74) *Attorney, Agent, or Firm*—Robert F. I. Conte; Lee, Mann, Smith, McWilliams, Sweeney, & Ohlson

(57) ABSTRACT

A test interface between cable testing apparatus and a coaxial cable for testing the coaxial cable over a frequency range of interest. The test interface comprises a coupler having a cable lead-in opening at a first end and a threaded, connector contact portion near a second end, an insert that abuts an interior shoulder of the coupler proximate the connector contact portion, the insert having a wall portion that projects outwardly toward the second end of the coupler, and a pin constructed and arranged to abut a center conductor of the coaxial cable, the pin substantially centrally positioned within the outwardly projecting wall portion of the insert. The coupler, insert, and pin mechanically and electrically interconnect with a mating electrical connector to provide a reusable electrical connection between the cable testing apparatus and the coaxial cable.

13 Claims, 2 Drawing Sheets

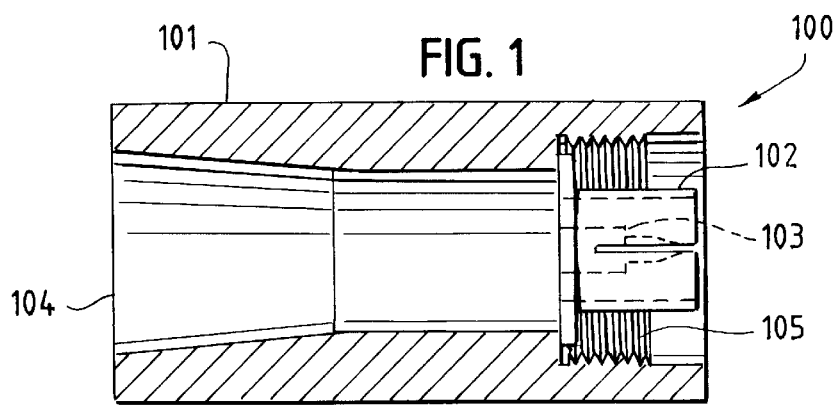
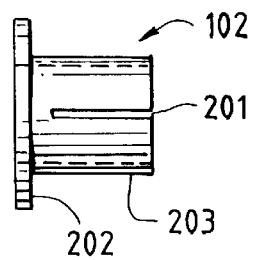
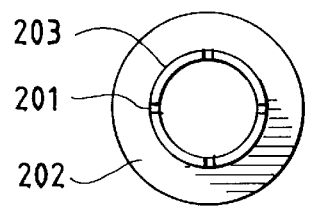
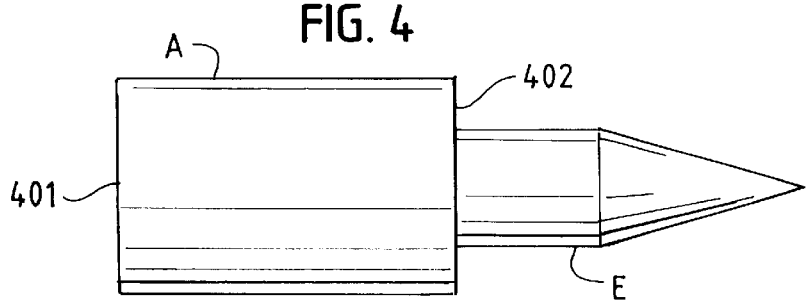
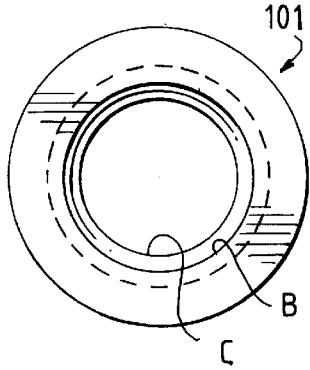
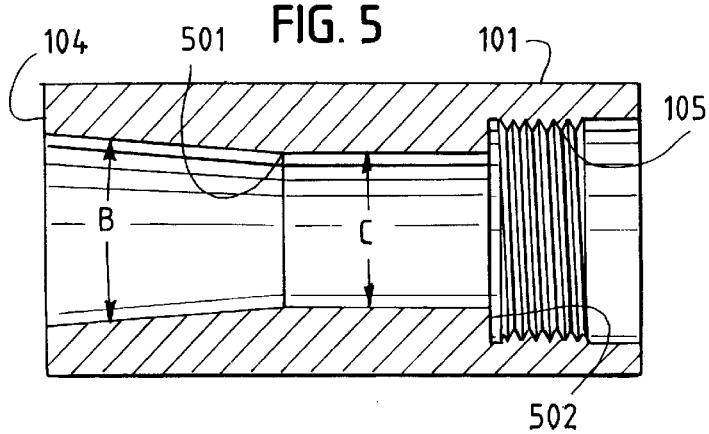

TEST INTERFACE FOR COAXIAL CABLE

FIELD OF THE INVENTION

This invention relates generally to testing of coaxial cable and in particular to an interface connector for use during testing, and is more particularly directed toward a test interface providing a temporary, high quality connection between testing apparatus and a length of coaxial cable under test.

BACKGROUND OF THE INVENTION

Generally, a coaxial cable has an inner central conductor, a dielectric surrounding the central conductor, and an outer conductor coaxial to and surrounding the central conductor. The inner conductor transmits signals and the outer conductor acts as a signal return and as a ground. The outer conductor also provides shielding for the inner conductor.

It is known that semi-rigid cable can be tested to determine if the electrical length of the cable is correct. U.S. Pat. No. 4,441,781 discloses using a test connector to determine if the electrical length is correct. If the length is correct, the test connector is removed and a coaxial connector is permanently terminated onto the coaxial cable.

However, known test connectors do not provide a high quality connection between the cable under test and the test apparatus. Testing multiple reels of flexible coaxial cable requires a connection to the test equipment that is quick, easy, and low cost. It must also provide high-quality electrical performance over a wide frequency range, so that cable performance is not masked by a poor quality test connection. Commercially available connectors with the required performance are designed for permanent installation. They are expensive and not generally reusable, and if an attempt is made to reuse them, it can generally be done only a few times. It is very time consuming to remove and reinstall these commercially available connectors on the next cable to be tested.

Consequently, a need arises for a temporary, reusable test connection between testing apparatus and a section of coaxial cable under test that is economical, easy to connect and disconnect, and that provides a high-quality connection over a wide range of frequencies.

SUMMARY OF THE INVENTION

These needs and others are satisfied by the test interface of the present invention. The present invention comprises a new connector design conceptualized by using the type N connector on the test equipment and the coaxial cable only as constraints. The electrical performance is better than known designs of the prior art, having good electrical performance extending to a test frequency of six gigahertz or greater. It provides ease of use with its sliding cable insertion and removal, and is readily reusable over a large number of insertion and removal cycles.

Key design features of this new interface are the length and shape of the connector center conductor (i.e., pin), and the design of the connector body. The new connector body allows the length of the pin to be shortened to the minimum length possible. The pin length, from the end of the socket at which it mates to the end of the pin that contacts the cable center conductor, is reduced to about one-tenth electrical wavelength at the upper frequency of interest.

The end of the pin that contacts the cable does not have the shoulder that was commonplace in older test connector systems. Removing this shoulder eliminates a large impedance variation in the interface, as well as eliminating the resulting poor electrical performance at frequencies above one gigahertz.

In accordance with one aspect of the present invention, a test interface is provided between cable testing apparatus and a coaxial cable for testing the coaxial cable over a frequency range of interest that extends from a lower frequency to an upper frequency. The coaxial cable includes a center conductor, a dielectric portion, and a shield conductor, and the test interface accommodates a prepared coaxial cable end wherein the coaxial cable shield conductor is folded back along its length and the center conductor and dielectric portions are trimmed substantially flush with the fold. The test interface comprises a coupler having a cable lead-in opening at a first end and a threaded, connector contact portion near a second end, an insert that abuts an interior shoulder of the coupler proximate the connector contact portion, the insert having a wall portion that projects outwardly toward the second end of the coupler, and a pin constructed and arranged to abut a center conductor of the coaxial cable, the pin substantially centrally positioned within the outwardly projecting wall portion of the insert. The coupler, insert, and pin mechanically and electrically interconnect with a mating electrical connector to provide a reusable electrical connection between the cable testing apparatus and the coaxial cable.

In one form of the invention, the coupler includes a substantially conical lead-in portion that begins proximate a cable entry end of the coupler, the conical lead-in portion tapering substantially linearly to a relatively constant-diameter cable contact portion. Preferably, the conical lead-in portion tapers substantially linearly at a taper angle of approximately 10 degrees. The insert may have a plurality of cutouts disposed about the perimeter of the wall portion of the insert, in substantially equally spaced relation.

The pin preferably includes a body portion and an end portion, the end portion meeting the body portion at a distinct shoulder, and constructed and arranged to engage a center contact of a mating connector, and the body portion including a mating surface, distal from the end portion thereof, constructed and arranged to abut the center conductor of the coaxial cable. Preferably, the body portion of the pin has a length of about one-tenth wavelength at the upper frequency of interest. The mating connector may be a female type-N connector.

Further objects, features, and advantages of the present invention will become apparent from the following description and drawings.

BRIEF DESCRIPTION OF THE DRAWINGS

FIG. 1 represents a test interface in accordance with the present invention in section view;

FIG. 2 is a side elevational view of an insert from the test interface of FIG. 1;

FIG. 3 is an end elevational view of the insert of FIG. 2;

FIG. 4 is a side elevational view of a pin from the test interface of FIG. 1;

FIG. 5 is a section view of a portion of the test interface of FIG. 1;

FIG. 6 is an end elevational view of the portion depicted in FIG. 5; and

DETAILED DESCRIPTION OF THE INVENTION

Figure 7:
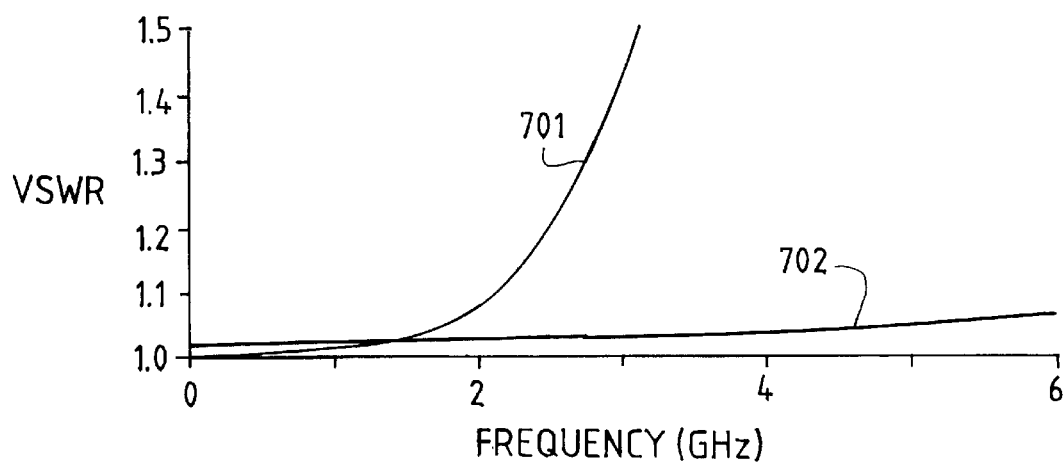
FIG. 7 depicts VSWR versus frequency performance of the test interface of FIG. 1.
Figure 8:
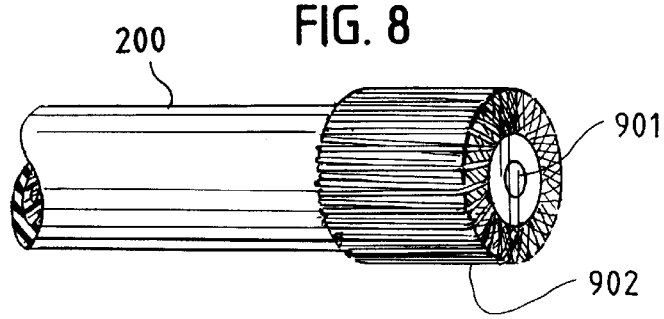
FIG. 8 is a perspective view of a prepared cable ready for insert into the test interface.
Figure 9:
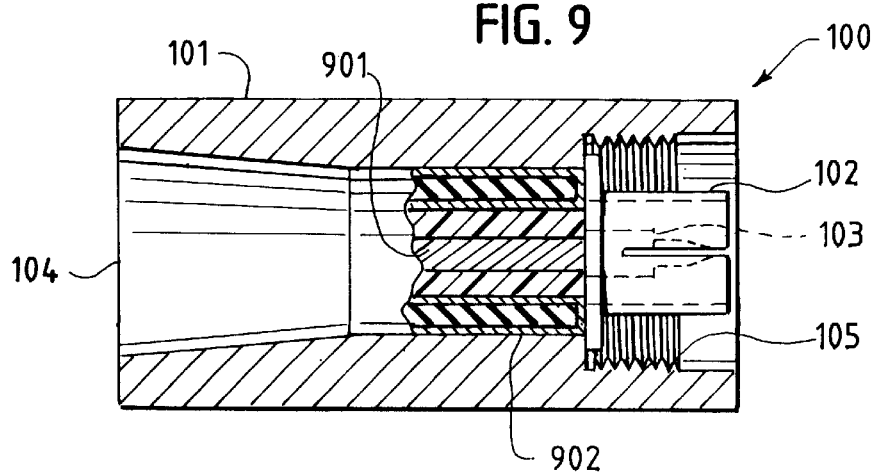
FIG. 9 is a longitudinally taken cross sectional view of a prepared cable inserted into the test interface.

There is described herein a test interface for coaxial cable that offers distinct advantages when compared to the prior art. It is known that a high quality connector should maintain the same impedance through the connector as exists in the cable being tested (and the test equipment to which it is connected). In a coaxial cable (or a connector), the impedance is determined by the ratio of the center and outer conductor diameters and the characteristics of the material between these two conductive elements. The standard type N connector interface is commonly present on the testing equipment used to test coaxial cable. Its center and outer conductor diameters are fixed, but those of coaxial cable depend on the design size.

In order to accommodate the difference in diameters between the type N connector interface and coaxial cables of known size, a tapered diameter change within the connector was attempted. This technique is often employed with large-diameter rigid coaxial transmission line, when a transition from one size to another is necessary. Rigid lines are constructed from rigid copper tubing in commercial sizes from ⅞ inch to 9 3/16 inches outside diameter.

Tapered transition test connectors for several cable sizes were tested, yielding mixed results. The greater the diameter change from one end of the connector to the other, the poorer the performance was. The suspected causes were the difficulty in holding close dimensional tolerances in the insulating material between the center and outer conductors and the difficulty in creating a full circumference connection at the abutment between the cable and connector center conductors.

Consequently, a new style test connector was developed that used a step transition between the cable and type N connector diameters. It comprised a custom adapter inserted into the body of a commercially made type N connector. A custom connector center conductor was also manufactured. The design proved to have improved electrical performance but exhibited a tendency to degrade in performance at the high end of the frequency range. The performance was still too sensitive to the quality of the connection between the cable and the connector.

From the test results on the tapered transition connectors, it was discovered that the frequency at which the degradation in electrical performance occurred was related to the length of the connector center conductor. The shorter length step transition center conductor moved the point where degradation began to a higher frequency. The body of this step transition connector precluded further shortening of the connector, which led to the design of a new connector, which is the subject of the present invention.

FIG. 1 illustrates a test interface in accordance with the present invention, generally depicted by the numeral 100. The interface includes a coupler 101, an insert 102, and a pin 103. The coupler 101 is preferably cylindrical in general appearance, and is constructed from brass, although other durable conductive materials would also be suitable.

One end of a length of coaxial cable under test is guided into cable entry opening 104, and inserted until the cable 900 under test contacts the end of insert 102 that is closest to the cable entry opening 104. In preparing a coaxial cable for testing, approximately 2.54 cm of the outer protective covering of the cable is removed, and the uncovered shield braid is folded back along the remaining outer protective covering. The protruding end portion of the cable, including any shielding tape that may be present, along with the dielectric material and center conductor, is then trimmed flush with the end of the folded back shield braid. Consequently, when the properly prepared cable is inserted into the cable entry end 104 of the coupler 101, the center conductor of the coaxial cable 901 under test firmly contacts the pin 103, while the interior portion of the coupler 101 makes electrical contact with the shield braid 902 of the coax under test.

As will be apparent from an examination of FIG. 1, the configuration of the insert 102 and pin 103, as well as the threaded interior portion 105 of the coupler 101 are designed to engage with a female coaxial connector, thus providing a high-quality connection between test apparatus and a coaxial cable under test. Preferably, the coaxial connector is an N-type connector, although the design may be adapted for use with connectors of other types as well.

FIG. 2 depicts the insert 102 in greater detail. The insert 102 is also preferably fabricated from brass, but other durable conductive materials may also be suitable in this application. The insert 102 includes a base portion 202 and an upstanding wall portion 203. In operation, the base portion 202 of the insert 102 abuts an interior shoulder 502 of the coupler 101 (shown in FIG. 5).

Since the interface 100 is designed to engage a female N-type connector, as noted above, the wall portion 203 of the insert 102 may be provided with cutouts 201, preferably in four places, to allow the wall portion 203 a certain amount of deflection in engaging with the mating portion of the female type N connector. FIG. 3 is an end view of the insert 102 that illustrates the cutouts 201 in their preferred, substantially equally-spaced relation around the circumference of the wall portion 203 of the insert 102.

FIG. 4 shows the pin 103 in greater detail. The pin 103 is also preferably fabricated from brass, but, as acknowledged above, there are other durable conductive materials that may also be suitable for the pin 103. The pin 103 has a body portion A and an end portion E. The end portion E is preferably designed to mate with the female contact member of a mating type-N female connector. The body portion A includes a mating surface 401 that mates with the center conductor of a coaxial cable under test when the coaxial cable under test is properly and completely inserted into the cable entry end 104 of the coupler 101 (FIG. 1).

The body portion A of the pin 103 is preferably of a length corresponding to about one-tenth wavelength at the maximum frequency of interest. For example, for a system designed to test coaxial cable to an upper frequency of about 6 gigahertz, the body portion A of the pin 103, measured between the abutment surface 401 where the pin 103 engages the center conductor of the coax cable under test, and the opposite face 402 of the body portion A, which represents the effective end of the socket-type center-contact member of the mating N-type female connector (not shown), should be about 5 mm (millimeters) in length. In the preferred form of the invention, the actual length of the body portion A is about 5 mm. The point 402 where the end portion E joins the body portion A creates a distinct shoulder or step in the pin 103, as indicated in FIG. 4. The diameter of pin 103 at point 401 is substantially the same as the outside diameter of the mating center contact.

FIG. 5 illustrates the coupling 101 in section view. Near the cable entry end 104 of the coupling 101, a substantially conical lead-in is provided. In the preferred form of the invention, this conical lead-in portion B is linearly tapered at an angle of about 10 degrees. Near the cable entry end 104, the diameter of the lead-in opening need only be slightly larger than the outside diameter of the coaxial cable being tested, to allow for ease of cable entry into the coupling 101. The tapered lead-in decreases in diameter linearly, until at transition point 501, the conical lead-in portion B smoothly transitions to a relatively constant-diameter cable contact portion C. The inside diameter of this cable contact portion C is preferably designed to provide nearly a press-fit with the cable under test, keeping in mind that a portion of the shield braid of the cable under test is folded back along its length for testing purposes. FIG. 6 provides an end-view of the coupler 101, taken from the cable entry end 104. In FIG. 6, the larger diameter of the lead-in portion B when compared with the cable contact portion C is readily apparent.

FIG. 7 illustrates the improvement in performance of the test interface of the present invention when compared with known test connectors of the prior art. FIG. 7 provides voltage standing wave ratio (VSWR) versus frequency information. As is well-known in the art, the VSWR of a test interface is a convenient indicator of the impedance match being achieved. A VSWR of 1.0 would indicate a perfect impedance match, which is not achievable in practice. However, the plot 702 of the inventive interface does indicate a VSWR of less than 1.1 over a frequency range extending to six gigahertz, which is perfectly suitable for cable testing, and represents a vast improvement over interface systems of the prior art. As shown in FIG. 7, the plot 701 of a prior art system indicates rapid degradation of VSWR beginning near two gigahertz, and reaching an unusable VSWR of 1.5 in the vicinity of three gigahertz.

There has been described herein a test interface for coaxial cable that offers distinct advantages when compared with the prior art. It will be apparent to those skilled in the art that modifications may be made without departing from the spirit and scope of the invention. For example, a design for mating with a male connector can easily be adapted from the preceding description. Accordingly, it is not intended that the invention be limited except as may be necessary in view of the appended claims.

What is claimed is:

1. A test interface between cable testing apparatus and a coaxial cable for testing the coaxial cable over a frequency range of interest that extends from a lower frequency to an upper frequency, the coaxial cable including a center conductor, a dielectric portion, and a shield conductor, in which the test interface accommodates a prepared coaxial cable end wherein the coaxial cable shield conductor is folded back along its length and the center conductor and dielectric portions are trimmed substantially flush with the fold, the test interface comprising:

a coupler having a cable lead-in opening at a first end and a threaded, connector contact portion near a second end;

an insert that abuts an interior shoulder of the coupler proximate the connector contact portion, the insert having a wall portion that projects outwardly toward the second end of the coupler; and a pin constructed and arranged to abut a center conductor of the coaxial cable, the pin substantially centrally positioned within the outwardly projecting wall portion of the insert;

such that said coupler, insert, and pin mechanically and electrically interconnect with a mating electrical connector to provide a reusable electrical connection between the cable testing apparatus and the coaxial cable.

2. A test interface between cable testing apparatus and a coaxial cable for testing the coaxial cable over a frequency range of interest that extends from a lower frequency to an upper frequency, the coaxial cable including a center conductor, a dielectric portion, and a shield conductor, in which the test interface accommodates a prepared coaxial cable end wherein the coaxial cable shield conductor is folded back along its length and the center conductor and dielectric portions are trimmed substantially flush with the fold, the test interface comprising:

a coupler having a cable lead-in opening at a first end, a threaded connector contact portion near a second end and a substantially conical lead-in portion that begins proximate a cable entry end of the coupler, the conical lead-in portion tapering substantially linearly to a relatively constant-diameter cable contact portion;

an insert that abuts an interior shoulder of the coupler proximate the connector contact portion, the insert having a wall portion that projects outwardly toward the second end of the coupler; and a pin constructed and arranged to abut a center conductor of the coaxial cable, the pin substantially centrally positioned within the outwardly projecting wall portion of the insert;

such that said coupler, insert, and pin mechanically and electrically interconnect with a mating electrical connector to provide a reusable electrical connection between the cable testing apparatus and the coaxial cable.

3. The test interface of claim 2, wherein the substantially conical lead-in portion tapers substantially linearly at a taper angle of approximately 10 degrees.

4. The test interface of claim 2, wherein the insert includes a plurality of cutouts disposed about the perimeter of the wall portion of the insert, in substantially equally spaced relation.

5. The test interface of claim 4, wherein the insert includes four substantially equally spaced cutouts.

6. The test interface of claim 2, wherein the pin includes a body portion and an end portion, the end portion meeting the body portion at a distinct shoulder, and constructed and arranged to engage a center contact of a mating connector, and the body portion including a mating surface, distal from the end portion thereof, constructed and arranged to abut the center conductor of the coaxial cable.

7. The test interface of claim 6, wherein the mating connector is a female type-N connector.

8. The test interface of claim 6, wherein the body portion of the pin has a length of about one-tenth wavelength at the upper frequency of interest.

9. A test interface between cable testing apparatus and a coaxial cable for testing the coaxial cable over a frequency range of interest that extends from a lower frequency to an upper frequency, the coaxial cable including a center conductor, a dielectric portion, and a shield conductor, in which the test interface accommodates a prepared coaxial cable end wherein the coaxial cable shield conductor is folded back along its length and the center conductor and dielectric portions are trimmed substantially flush with the fold, the test interface comprising:

a coupler including a substantially conical lead-in a portion that begins proximate a cable entry end of the coupler, the conical lead-in portion tapering substantially linearly to a relatively constant-diameter cable contact portion, and having a threaded, connector contact portion near a second end;

an insert that abuts an interior shoulder of the coupler proximate the connector contact portion, the insert having a wall portion that projects outwardly toward the second end of the coupler; and a pin constructed and arranged to abut a center conductor of the coaxial cable, the pin substantially centrally positioned within the outwardly projecting wall portion of the insert, the pin including a body portion and an end portion, the end portion meeting the body portion at a distinct shoulder, and constructed and arranged to engage a center contact of a mating connector, and the body portion including a mating surface, distal from the end portion thereof, constructed and arranged to abut the center conductor of the coaxial cable, and wherein the body portion of the pin has a length of about one-tenth wavelength at the upper frequency of interest;

such that said coupler, insert, and pin mechanically and electrically interconnect with a mating electrical connector to provide a reusable electrical connection between the cable testing apparatus and the coaxial cable.

10. The test interface of claim 9, wherein the substantially conical lead-in portion tapers substantially linearly at a taper angle of approximately 10 degrees.

11. The test interface of claim 9, wherein the mating connector is a female type-N connector.

12. The test interface of claim 9, wherein the insert includes a plurality of cutouts disposed about the perimeter of the wall portion of the insert, in substantially equally spaced relation.

13. The test interface of claim 12, wherein the insert includes four substantially equally spaced cutouts.

* * * * *